United States Patent

Brugger et al.

[11] Patent Number: 6,080,513
[45] Date of Patent: Jun. 27, 2000

[54] MASK AND METHOD FOR MODIFICATION OF A SURFACE

[75] Inventors: Juergen Brugger, Zurich; Michel Despont, Bioley-Orjulaz; Peter Vettiger, Langnau, all of Switzerland

[73] Assignee: International Business Machines Corporation, Armonk, N.Y.

[21] Appl. No.: 09/072,534

[22] Filed: May 4, 1998

[51] Int. Cl.[7] .................................................. G03F 9/00
[52] U.S. Cl. ................................................ 430/5; 430/323
[58] Field of Search ........................... 430/5, 322, 323, 430/313, 396

[56] References Cited

U.S. PATENT DOCUMENTS 4,479,830  10/1984  Koshino et al. .................... 438/34
5,403,684   4/1995  Schroeder et al. .................... 430/5

*Primary Examiner*—S. Rosasco
*Attorney, Agent, or Firm*—Ronald L. Drumheller

[57] ABSTRACT

A surface of a substrate (3) is to be exposed to a medium (11) directed towards said surface and which modifies said surface. A mask (4) to be used therefor has at least one opening (9) through which said medium (11) is allowed to reach said surface. The opening (9) is located in a protrusion (10) of said mask (4) which is directed versus said surface.

9 Claims, 1 Drawing Sheet

MASK AND METHOD FOR MODIFICATION OF A SURFACE

TECHNICAL FIELD

The invention relates to a mask for the use in area-selective modification of a surface of a substrate and to a method for area-selective modification of a surface of a substrate. More particularly, it relates to a mask for use in lithographic modification of semiconductor substrates inside a recess which is very deep in comparison with the substrate thickness, and to a method which uses the above mask.

BACKGROUND OF THE INVENTION

A typical application field for the invented mask is the manufacturing of wafers with micromechanical devices, e.g. cantilevers for AFMs, pressure- and gas-sensors. These devices are often made of very thin Si-membranes whereas surrounding areas of the wafer remain at the original wafer thickness. The membranes are usually created by thinning the wafers of the backside. Further processing of the membranes from the backside is difficult or even impossible, e.g. when using spin coating of photoresists over such large topographies, since very large thickness variations of the coated film occur and the extreme required depth of focus limits the achievable resolution. Therefore, membrane-type devices are usually processed from the top side of the membrane while the wafer has its original thickness. This however limits the achievable functionality and fabrication simplicity of the devices.

U.S. Pat. No. 5,234,781 describes a mask for lithographic patterning and a method of manufacturing the same. Therein a substrate is to be processed from both sides, the front side and the back side. Therewith, a substrate is obtained with a recess which has a very big depth compared to the original substrate thickness. The recess hence leaves a membrane-like region in the substrate. To obtain a patterning of the membrane-like region, the substrate is processed from the front side before the recess is created from the back side.

Another example of that kind is provided in U.S. Pat. No. 4,855,197 wherein a mask for ion, electron or x-ray lithography and a method of making it is described.

Since the patterning of the membrane in the state of the art is conducted from the front side, fairly good results with conventional mask-assisted lithography methods are achieved.

A conventional method using conventional masks would lead to unacceptable patterning results when being used for a back side lithography of an already existing membrane-like region. This results e.g. from the so-called shadow effect which can create a parallax of the created pattern towards the wanted pattern. Another effect is the blurring of the mask pattern due to beam widening in the space between the mask and the surface.

OBJECT AND ADVANTAGES OF THE INVENTION

It is an object of the invention to provide a mask and a method using such a mask which brings better results for a surface modification, although the mask is not in full contact with the surface.

The mask eliminates the need for photolithographical steps (coating, patterning with light, developing, debris removal). With the mask, a very precise pattern transfer from mask to wafer is possible, even if a divergent material beam is used, e.g. with e-gun evaporation.

Another advantage is that the mask is reusable since it is not damaged or destroyed during the modification process. Hence, the mask can be used also multiple times which can be used for producing identically modified surfaces.

The result is achieved by bringing the effective opening through which a beam is allowed to reach the substrate surface, nearer to the surface, although the surface which is to be modified is not in full contact with the mask. This is done by locating the opening in a protrusion which is directed versus the surface.

When the protrusion protrudes into a recess in the surface, the advantage of the claimed mask respectively method becomes most apparent since the effective opening is brought nearer to the bottom of the recess where as a consequence more precise patterns can be created.

The most precise result can be achieved when the protrusion has a height which is at least approximately identical to the depth of the recess because then the shadow effect is minimal.

Since the protrusion is already a structure which makes the mask a three-dimensional object, the provision of alignment means which is supposed to fit into corresponding counter-alignment means at said substrate is a way of achieving very precise alignment without additional process steps. Alignment via protrusions and corresponding recesses is a very precise alignment method and is not as prone to misalignment as are e.g. optical alignment methods or means.

When the alignment means is arranged separate from the protrusion, the protrusion can be designed without taking care of a second function, namely the alignment function. This facilitates mask design and manufacturing.

On the other hand, when the protrusion itself is designed to serve as the alignment means, two functions are achieved in one, so that no space on the substrate and on the mask is wasted for the pure alignment function. Additionally, the alignment then takes place exactly where it is needed and not at some place distant from there. This again increases the achievable precision.

When the mask has a crystalline structure and that at least one sidewall of the alignment means lies in a crystallographic plane which is produceable by anisotropic etching, the precision of the alignment is very high due to the fact that the crystallographic planes always remain at the naturally pregiven angle of the crystallographic plane. When the counteralignment means is manufactured the same way, a precise match is guaranteed.

SUMMARY OF THE INVENTION

The invented mask and method is usable for area-selective modification of a surface of a substrate, e.g. a deposition of a material on a semiconductor wafer surface. Such a mask respectively method is used when the substrate is exposed for instance to a beam of a medium, e.g. a material which is to be deposited, the beam being directed towards the surface. The mask has at least one opening through which the beam is allowed to reach the surface. The opening is located in a protrusion of the mask which is directed versus the surface.

DESCRIPTION OF THE DRAWINGS

Examples of the invention are depicted in the drawings and described in detail below by way of example. It is shown in FIG. 1: a first embodiment with a cross-section of a substrate with a mask with a protrusion and with separate alignment means.

All the figures are for sake of clarity not shown in real dimensions, nor are the relations between the dimensions shown in a realistic scale.

DETAILED DESCRIPTION OF THE INVENTION

In the following, the various exemplary embodiments of the invention are described.

Figure 1:
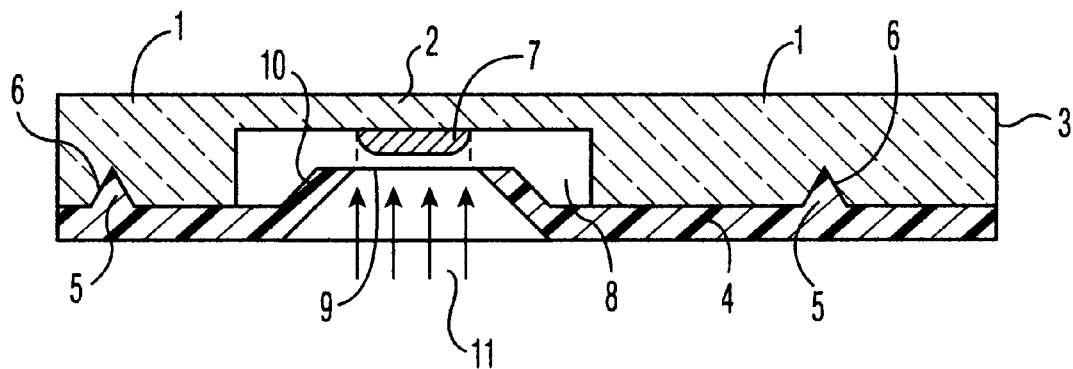

In FIG. 1, a flat substrate 1 which here is a semiconductor wafer, comprises two parts, namely a first part 1 which has a first thickness, that is here the thickness of a commercially available wafer, i.e. bigger than 1 mm, and a second part 2 which has a lower thickness, e.g. only a few m-Licrons. The second part 2 is hereinafter called membrane 2. The membrane 2 is situated inmidst of the first part 1 where the substrate 1 shows a corresponding recess 8. The substrate 1 further comprises in the first part 1 two notches 6 which serve as counteralignment means and correspond to protrusive elements 5 which are arranged on a flat mask 4 and are directed versus the surface of the substrate 1. The mask 4 further comprises a protrusion 10 which is also directed versus the surface of the substrate 1. The protrusion 10 is hollowed out by a conical recess which orifices in an opening 9 at the end of the protrusion 10 which is nearest to the substrate 1. The mask 4 is laid upon the surface of the substrate 1 which comprises the recess 8. The protrusive elements 5 lie in the notches 6 and the protrusion 10 comes to lie in the recess 8. The surface of the flat mask 4 comes into full contact with the surface of the first part 1 of the substrate 1. The height of the protrusion 10 is here smaller than the depth of the recess 8.

The arrangement is used for depositing a material 7 on a part of the membrane 2. Therefor, a medium such as a material beam 11 is directed on the mask and is only allowed to reach the surface of the substrate 1 through the opening 9. Hence, a pattern can be created with the mask 4. Due to the fact that the opening 9 comes to lie nearer to the membrane 2 than it would if the protrusion 10 were absent, the pattern created will show sharper contours than patterns created according to methods known from the state of the art. Since the notches 6 and the protrusive elements 5 take over the task of aligning the mask 4 with respect to the substrate 1, the protrusion 10 need not fit exactly in the recess 8.

Figure 2:
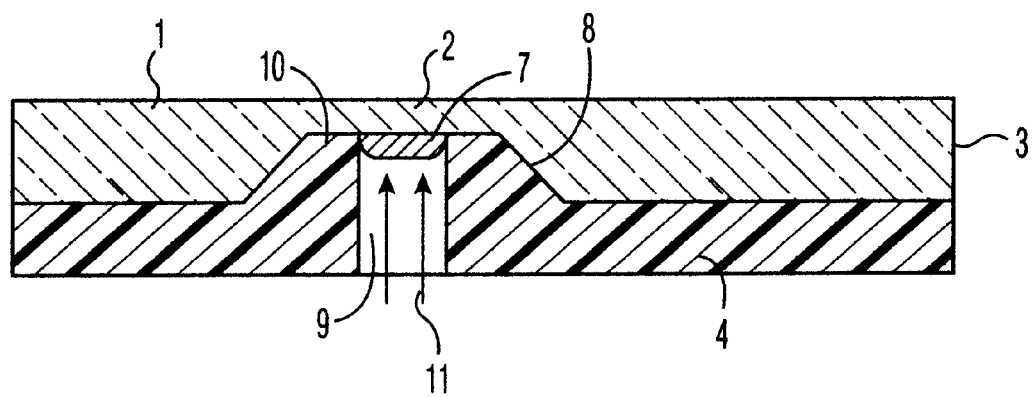
FIG. 2: a second embodiment with a protrusion which serves as alignment means.

In FIG. 2, another embodiment is depicted which uses the same numbering for identical parts as in FIG. 1. The following details differ from the above described embodiment:

The sidewalls of the recess 8 and of the protrusion 10 fit into each other, whereas no notches 6 and protrusive elements 5 are present. Furthermore, the protrusion 10 is as high as the recess 8 is deep. The protrusion 10 is hollowed out by a cylindrical recess, its diameter building the opening 9. Hence, here the mask 4 has essentially the negative surface of the substrate 1.

In this embodiment the protrusion 10 itself fulfills the alignment task. Since the sidewalls of the protrusion 10 and of the recess 8 are inclined, a rough prealignment suffices until these elements come into contact and perform an automatic fine alignment.

The second embodiment shows that it is most desirable to bring the opening 9 as close as possible to the membrane 2. However, there are applications, when a direct contact is not wanted because the membrane surface or eventual structures on it may be damaged by the mechanical contact.

A lot of materials for the substrate I as well for the mask I are crystalline and have the property of being anisotropically etchable. Such an anisotropic etching is useful because it results in naturally pregiven etch-stopping boundaries, such as the crystalline planes. A known anisotropically etched feature is the <111> plane of silicon which is inclined at an angle of 54.7° towards the substrate surface and which can e.g. be obtained by using KOH as etchant. Since this angle is a material constant, such planes may serve as automatically perfectly matching alignment means.

The exact match of the protrusion height to the recess depth results in a maximal precision of pattern. The contours will then be maximum sharp.

A very practicable way to achieve such a match, is for the mask 4 as well as the substrate 1 to be processed in parallel with the same parameters when producing the protrusion 10 and the recess 8.

Various processes for modifying the substrate surface using the above mask are possible: Deposition processes such as metal evaporation or epitaxial processes, treating processes such as implantation or doping, e-beam, ion-beam, photon exposure or removing processes such as dry- or wet etching.

The mask may also be dimensioned such that a certain amount of the mask material is sacrificed to the modification process. This becomes particularly attractive for etching processes which are not selective enough to leave the mask unetched.

The mask itself can be produced e.g. by using a standard semiconductor processing technique.

The following amendments are possible: Any type of alignment means can be used, also active alignment methods or optical alignment. The notches and protruding elements can also be exchanged with each other. Of course, also a plurality of even differently shaped protrusions can be combined on one mask. They may have different width, pitch and/or height and may also be combined with other mask elements which also may not need to be embedded in a protrusion. The invention covers generally any mask that comprises three dimensional elements which have an influence on the pattern to be created, particularly by reducing negative shading effects. Also, one or several protrusions may be arranged in a bigger protrusion. Then, the bigger protrusion may also perform the alignment task.

What is claimed is:

1. A mask for use in area-selective modification of a bottom surface of a recess in a substrate, said bottom surface of said recess being exposed to a beam directed towards said mask and selectively passing through at least one opening in said mask to reach said bottom surface of said recess, characterized in that said at least one opening is located in a protrusion of said mask, said protrusion being dimensioned so as to cause said protrusion to extend into said recess during use of said mask to bring said at least one opening closer to said bottom surface of said recess than a depth of said recess in order to reduce shadow effects.

2. Mask according to claim 1, characterized in that the protrusion has a height which is identical or less than the depth of the recess.

3. Mask according to claim 1, characterized in that it comprises at least one alignment means which is supposed to fit into corresponding counter-alignment means at said substrate.

4. Mask according to claim 3, characterized in that the alignment means is arranged separate from the protrusion.

5. Mask according to claim 3, characterized in that the protrusion itself is designed to serve as the alignment means.

6. Mask according to claim 3, characterized in that the mask has a crystalline structure and that at least one sidewall of the alignment means lies in a crystallographic plane which is produceable by anisotropic etching.

7. A method for area-selective modification of a bottom surface of a recess in a substrate wherein said bottom surface is exposed to a beam directed towards said bottom surface, characterized in that said beam is allowed to reach said bottom surface through at least one opening which is located in a protrusion of a mask, said protrusion extending into said recess so as to position said at least one opening closer to said bottom surface than a depth of said recess in order to reduce shadow effects.

8. Method according to claim 7, characterized in that the mask is aligned on the surface by using at least one alignment means which fits into corresponding counter-alignment means at said substrate.

9. Method according to claim 8, characterized in that the protrusion itself is used as the alignment means.

* * * * *